(12) United States Patent
Kleinschmidt

(10) Patent No.: US 6,700,915 B2
(45) Date of Patent: Mar. 2, 2004

(54) NARROW BAND EXCIMER LASER WITH A RESONATOR CONTAINING AN OPTICAL ELEMENT FOR MAKING WAVEFRONT CORRECTIONS

(75) Inventor: Juergen Kleinschmidt, Weissenfels (DE)

(73) Assignee: Lambda Physik AG, Goettingen (DE)

( * ) Notice: Subject to any disclaimer, the term of this patent is extended or adjusted under 35 U.S.C. 154(b) by 0 days.

(21) Appl. No.: 09/843,604

(22) Filed: Apr. 25, 2001

(65) Prior Publication Data

US 2002/0031158 A1 Mar. 14, 2002

Related U.S. Application Data

(63) Continuation-in-part of application No. 09/452,353, filed on Dec. 1, 1999, now Pat. No. 6,298,080.
(60) Provisional application No. 60/200,163, filed on Apr. 26, 2000, and provisional application No. 60/124,241, filed on Mar. 12, 1999.

(51) Int. Cl.[7] .............................. H01S 3/225; H01S 3/08
(52) U.S. Cl. .............................. 372/57; 372/58; 372/99; 372/102
(58) Field of Search .......................... 372/57, 58, 102, 372/99

(56) References Cited

U.S. PATENT DOCUMENTS

| | | | |
|---|---|---|---|
| 3,582,190 A | 6/1971 | Smith | 350/310 |
| 3,899,750 A | 8/1975 | Hochuli | 331/94.5 |
| 4,156,209 A | 5/1979 | Herbst et al. | 331/94.5 |
| 4,360,925 A | 11/1982 | Brosnan et al. | 372/95 |
| 4,393,505 A | 7/1983 | Fahlen | 372/57 |
| 4,399,540 A | 8/1983 | Bucher | 372/20 |
| 4,429,392 A | 1/1984 | Yoshida et al. | 372/9 |
| 4,477,909 A | 10/1984 | Salvi et al. | 372/95 |
| 4,534,034 A | 8/1985 | Hohla et al. | 372/59 |
| 4,611,270 A | 9/1986 | Klauminzer et al. | 364/183 |

(List continued on next page.)

FOREIGN PATENT DOCUMENTS

| | | | |
|---|---|---|---|
| DE | 42 25 781 | 2/1994 | H01S/3/08 |
| DE | 295 21 572 U1 | 12/1997 | H01S/3/038 |
| DE | 298 22 082 | 3/1999 | H01S/3/08 |
| DE | 298 22 090 | 3/1999 | H01S/3/08 |
| EP | 0 472 727 A1 | 3/1992 | H01S/3/1055 |
| JP | 5-152666 | 6/1993 | |
| WO | WO 96/16455 | 5/1996 | H01S/3/08 |

OTHER PUBLICATIONS

H.H. Barrett, et al., "Retroreflective Arrays as Approximate Phase Conjugators," *Optics Letters*, vol. 4, No. 6, Jun. 1979, pp. 190–192.

(List continued on next page.)

*Primary Examiner*—Paul Ip
*Assistant Examiner*—James Menefee
(74) *Attorney, Agent, or Firm*—Stallman & Pollock LLP

(57) ABSTRACT

A gas discharge laser system for generating a laser beam, such as an excimer or molecular fluorine laser system, includes a laser resonator with an optical element for making wavefront corrections such as an adaptable optical element, a phase conjugating mirror, or a retroreflector array. The resonator preferably also has one or more line-narrowing optical elements for narrowing the bandwidth of the laser beam. One of the resonator reflectors or a transmissive or reflective intracavity optical element of the laser may include the adaptable optical element, phase conjugating mirror or retroreflector plate. A beam expander may be disposed before the adaptable optical element, phase conjugating mirror or retroreflector array for increasing the radius of curvature of the wavefront of the laser beam. A detection and control system including a processor and a detector may be used for controlling the contour of the wavefront correcting optical element in a feedback loop.

23 Claims, 3 Drawing Sheets

U.S. PATENT DOCUMENTS

| | | | |
|---|---|---|---|
| 4,616,908 A | 10/1986 | King | 350/576 |
| 4,664,488 A | 5/1987 | Sawicki et al. | 350/611 |
| 4,691,322 A | 9/1987 | Nozue et al. | 372/82 |
| 4,696,012 A | 9/1987 | Harshaw | 372/99 |
| 4,740,982 A | 4/1988 | Hakuta et al. | 372/59 |
| 4,829,536 A | 5/1989 | Kajiyama et al. | 372/57 |
| 4,853,528 A * | 8/1989 | Byren et al. | 250/203 R |
| 4,856,018 A | 8/1989 | Nozue et al. | 372/98 |
| 4,860,300 A | 8/1989 | Baumler et al. | 372/57 |
| 4,873,692 A | 10/1989 | Johnson et al. | 372/20 |
| 4,905,243 A | 2/1990 | Lokai et al. | 372/32 |
| 4,906,087 A | 3/1990 | Ealey et al. | 359/611 |
| 4,918,704 A | 4/1990 | Caprara et al. | 372/99 |
| 4,926,428 A | 5/1990 | Kajiyama et al. | 372/20 |
| 4,972,429 A | 11/1990 | Herbst | 372/100 |
| 4,975,919 A | 12/1990 | Amada et al. | 372/33 |
| 4,977,573 A | 12/1990 | Bittenson et al. | 372/81 |
| 5,025,445 A | 6/1991 | Anderson et al. | 372/20 |
| 5,081,635 A | 1/1992 | Wakabayashi et al. | 372/57 |
| 5,090,020 A | 2/1992 | Bedwell | 372/59 |
| 5,095,492 A | 3/1992 | Sandstrom | 372/102 |
| 5,142,543 A | 8/1992 | Wakabayashi et al. | 372/32 |
| 5,150,370 A | 9/1992 | Furuya et al. | 372/106 |
| 5,221,823 A | 6/1993 | Usui | 219/121.78 |
| 5,226,050 A | 7/1993 | Burghardt | 372/20 |
| 5,325,378 A | 6/1994 | Zorabedian | 372/101 |
| 5,337,330 A | 8/1994 | Larson | 372/86 |
| 5,377,215 A | 12/1994 | Das et al. | 372/57 |
| 5,396,514 A | 3/1995 | Voss | 372/57 |
| 5,404,366 A | 4/1995 | Wakabayashi et al. | 372/29 |
| 5,440,578 A | 8/1995 | Sandstrom | 372/59 |
| 5,450,207 A | 9/1995 | Fomenkov | 250/226 |
| 5,450,436 A | 9/1995 | Mizoguchi et al. | 372/59 |
| 5,535,233 A | 7/1996 | Mizoguchi et al. | 372/87 |
| 5,557,629 A | 9/1996 | Mizoguchi et al. | 372/87 |
| 5,559,584 A | 9/1996 | Miyaji et al. | 355/73 |
| 5,559,816 A | 9/1996 | Basting et al. | 372/27 |
| 5,572,543 A | 11/1996 | Heinemann et al. | 372/107 |
| 5,596,456 A | 1/1997 | Luecke | 359/831 |
| 5,596,596 A | 1/1997 | Wakabayashi et al. | 372/102 |
| 5,642,374 A | 6/1997 | Wakabayashi et al. | 372/57 |
| 5,646,954 A | 7/1997 | Das et al. | 372/55 |
| 5,657,334 A | 8/1997 | Das et al. | 372/33 |
| 5,659,419 A | 8/1997 | Lokai et al. | 359/330 |
| 5,663,973 A | 9/1997 | Stamm et al. | 372/20 |
| 5,684,545 A * | 11/1997 | Dou et al. | 349/1 |
| 5,684,822 A | 11/1997 | Partlo | 372/95 |
| 5,684,824 A | 11/1997 | Hayakawa | 372/101 |
| 5,729,562 A | 3/1998 | Birx et al. | 372/38 |
| 5,729,565 A | 3/1998 | Meller et al. | 372/87 |
| 5,748,316 A | 5/1998 | Wakabayashi et al. | 356/352 |
| 5,748,346 A | 5/1998 | David et al. | 359/15 |
| 5,761,236 A | 6/1998 | Kleinschmidt et al. | 372/100 |
| 5,763,855 A | 6/1998 | Shioji | 219/121.84 |
| 5,802,094 A | 9/1998 | Wakabayashi et al. | 372/57 |
| 5,811,753 A | 9/1998 | Weick | 219/122.78 |
| 5,818,865 A | 10/1998 | Watson et al. | 372/86 |
| 5,835,520 A | 11/1998 | Das et al. | 372/57 |
| 5,852,627 A | 12/1998 | Ershov | 372/108 |
| 5,856,991 A | 1/1999 | Ershov | 372/57 |
| 5,875,207 A | 2/1999 | Osmanow | 372/86 |
| 5,898,725 A | 4/1999 | Fomenkov et al. | 372/102 |
| 5,901,163 A | 5/1999 | Ershov | 372/20 |
| 5,914,974 A | 6/1999 | Partlo et al. | 372/38 |
| 5,917,849 A | 6/1999 | Ershov | 372/102 |
| 5,936,988 A | 8/1999 | Partlo et al. | 372/38 |
| 5,940,421 A | 8/1999 | Partlo et al. | 372/38 |
| 5,946,337 A | 8/1999 | Govorkov et al. | 372/92 |
| 5,949,806 A | 9/1999 | Ness et al. | 372/38 |
| 5,949,974 A | 9/1999 | Ewing et al. | 395/200.32 |
| 5,970,082 A * | 10/1999 | Ershov | 372/102 |
| 5,978,391 A | 11/1999 | Das et al. | 372/20 |
| 5,978,394 A | 11/1999 | Newman et al. | 372/32 |
| 5,978,406 A | 11/1999 | Rokni et al. | 372/58 |
| 5,978,409 A | 11/1999 | Das et al. | 372/100 |
| 5,982,795 A | 11/1999 | Rothweil et al. | 372/38 |
| 5,982,800 A | 11/1999 | Ishihara et al. | 372/57 |
| 5,991,324 A | 11/1999 | Knowles et al. | 372/57 |
| 5,999,318 A | 12/1999 | Morton et al. | 359/572 |
| 6,005,880 A | 12/1999 | Basting et al. | 372/38 |
| 6,014,206 A | 1/2000 | Basting et al. | 356/138 |
| 6,020,723 A | 2/2000 | Desor et al. | 320/166 |
| 6,021,153 A | 2/2000 | Okada | 372/99 |
| 6,028,872 A | 2/2000 | Partlo et al. | 372/38 |
| 6,028,879 A | 2/2000 | Ershov | 372/57 |
| 6,028,880 A | 2/2000 | Carlesi et al. | 372/58 |
| 6,061,382 A | 5/2000 | Govorkov et al. | 372/101 |
| 6,081,542 A | 6/2000 | Scaggs | 372/70 |
| 6,094,448 A | 7/2000 | Fomenkov et al. | 372/102 |
| 6,151,346 A | 11/2000 | Partlo et al. | 372/38 |
| 6,154,470 A | 11/2000 | Basting et al. | 372/19 |
| 6,157,662 A | 12/2000 | Scaggs et al. | 372/60 |
| 6,160,831 A | 12/2000 | Kleinschmidt et al. | 372/57 |
| 6,160,832 A | 12/2000 | Kleinschmidt et al. | 372/57 |
| 6,163,559 A | 12/2000 | Watson | 372/102 |
| 6,192,064 B1 | 2/2001 | Algots et al. | 372/99 |
| 6,198,761 B1 | 3/2001 | von Bergmann et al. | 372/86 |
| 6,212,214 B1 | 4/2001 | Vogler et al. | 372/59 |
| 6,212,217 B1 | 4/2001 | Erie et al. | 372/102 |
| 6,219,368 B1 | 4/2001 | Govorkov | 372/59 |
| 6,226,307 B1 | 5/2001 | Desor et al. | 372/37 |
| 6,243,405 B1 | 6/2001 | Borneis et al. | 372/57 |
| 6,243,406 B1 | 6/2001 | Heist et al. | 372/59 |
| 6,269,110 B1 | 7/2001 | Leinhos et al. | 372/57 |
| 6,272,158 B1 | 8/2001 | Kleinschmidt et al. | 372/32 |
| 6,285,701 B1 | 9/2001 | Albrecht et al. | 372/57 |
| 6,298,080 B1 | 10/2001 | Heist et al. | 372/99 |
| 6,330,261 B1 | 12/2001 | Ishihara et al. | 372/38.1 |
| 6,404,796 B1 | 6/2002 | Albrecht et al. | 372/57 |

OTHER PUBLICATIONS

N. Tan–No, et al., "Dispersion–free Amplification and Oscillation in Phase–Conjugate Four–wave Mixing in an Atomic Vapor Doublet," *IEEE Journal of Quantum Electronics*, vol. QE–16, No. 2, Feb. 1980, pp. 147–153.

M.D. Levenson, et al., "Projection Photolithography by Wave–front Conjugation," *J. Opt. Soc. Am.*, vol. 71, No. 6, Jun. 1981, pp. 737–743.

Irving J. Bigio et al., "Injection–Locking Unstable Resonator Excimer Lasers," *IEEE J. of Quantum Electronics*, vol. QE–19, No. 9, Sep. 1983, pp. 1426–1436.

R.S. Taylor, "Preionization and Discharge Stability Study of Long Optical Pulse Duration UV–Preionized XeCl Lasers," *Applied Physiks B*, vol. B41., No. 1, Sep. 1986.

R.L. Sandstrom, "Measurements of Beam Characteristics Relevant to DUV Microlithography on KrF Excimer Laser," *Optical/Laser Microlithography III*, SPIE vol. 1264, 1990, pp. 505–519.

R.K. Tyson, Principles of Adaptive Optics, $2^{nd}$ edition, 1991, pp. 121–276.

Shintaro Kawata et al., "Spatial Coherence of KrF Excimer Lasers," *Applied Optics*, vol. 31, No. 3, Jan. 20, 1992, pp. 387–396.

Press Release entitled, "Lambda Physik Shows Readiness for the Future Challenges of Microlithography," Fort Lauderdale, FL., Dec. 1997.

Technology World Briefs, "Laser Could Extend Optical Lithography into VUV," *Photonics Spectra*, Jan. 1998.

* cited by examiner

NARROW BAND EXCIMER LASER WITH A RESONATOR CONTAINING AN OPTICAL ELEMENT FOR MAKING WAVEFRONT CORRECTIONS

PRIORITY

This application claims the benefit of priority to U.S. provisional patent application No. 60/200,163, filed Apr. 26, 2000, and this application is a Continuation-in-Part of U.S. patent application Ser. No. 09/452,353, filed Dec. 1, 1999 now U.S. Pat. No. 6,298,080, which claims the benefit of priority to U.S. provisional application No. 60/124,241, filed Mar. 12, 1999.

BACKGROUND OF THE INVENTION

1. Field of the Invention

The invention relates to an excimer or molecular fluorine laser, particularly having a resonator configured with adaptive or phase conjugative optics for correcting wavefront distortions generated as a result of thermally-induced refractive index fluctuations of resonator optics.

2. Description of the Related Art

Excimer lasers and molecular fluorine lasers are used for photolithographic production of integrated circuit device. Achromatic imaging optics for the output emission wavelengths of these lasers are difficult to produce. For this reason, line narrowing optical resonators are used for these photolithographic applications to prevent errors caused by chromatic aberrations. Typically acceptable bandwidths for different imaging systems are tabulated in Table 1, below, for the KrF excimer laser emitting at around 248 nm, the ArF excimer laser emitting at around 193 nm and the molecular fluorine laser emitting at around 157 nm.

TABLE 1

| Imaging Optics | 248 nm | 193 nm | 157 nm |
| --- | --- | --- | --- |
| Refractive Optics | 0.4–0.6 pm | 0.3–0.6 pm | 0.1 pm |
| Reflective Optics | 20–100 pm | 10–40 pm | ≈1 pm |

Current lithography lasers operate at repetition rates typically of up to 2 kHz. To produce higher throughput, it is desired to operate these lithography lasers at higher repetition rates such as 4 kHz or more (e.g., even 10 kHz or more). The averaged power incident upon optical elements within the laser cavity generally increases as the laser is operated at higher and higher repetition rates, and will rise by a factor of two or more when the repetition rate is increased from 2 kHz to 4 kHz or more. A very high thermal load on intracavity optical components, especially of narrow band optics such as prisms or etalons, can cause undesirable wavefront distortions in the laser beam, even at 1–2 kHz, and especially at higher repetition rates. These wavefront distortions are caused by thermally induced changes of the refractive indices of materials of the intracavity optical components resulting in time dependent variations of the spectral distribution of the laser beam, and of near and far field intensity distributions. It is desired to have a high power laser, particularly for photolithographic applications, wherein effects of wavefront distortions are reduced or prevented, such as by providing a resonator having intracavity wavefront correction or compensation.

SUMMARY OF THE INVENTION

In view of the above, a gas discharge laser system is provided including a discharge chamber filled with a gas mixture, multiple electrodes within the discharge chamber connected to a discharge circuit for energizing the gas mixture, and a resonator including the discharge chamber therein for generating a laser beam. The resonator further includes a retro-reflective array for making wavefront corrections to the laser beam, a beam expander before the retro-reflective array for increasing a radius of curvature of the wavefront associated with the laser beam incident on the beam expander, and one or more line-narrowing optical elements for narrowing a bandwidth of the laser beam.

The retro-reflective array may have a non-planar contour fit approximately to an average wavefront contour of the laser beam incident upon the array for making the wavefront corrections. The non-planar contour may be adjustable for controlling the contour to fit the wavefront contour. In this case, the laser system may include a detection and control system including a detector and a processor for monitoring a parameter of the laser beam indicative of the fitting of the contour of the retro-reflective array to the contour of the wavefront. The processor may be connected in a feedback loop with the array for controlling the contour of the array based upon information received from the detector. The detection and control system may also include a spectrometer.

In further view of the above, a gas discharge laser system is provided including a discharge chamber filled with a gas mixture, multiple electrodes within the discharge chamber connected to a discharge circuit for energizing the gas mixture, and a resonator including the discharge chamber therein for generating a laser beam. The resonator further includes a phase conjugate mirror for making wavefront corrections, and one or more line-narrowing optical elements for narrowing a bandwidth of the laser beam. The resonator may further include a beam expander before the phase conjugate mirror for increasing a radius of curvature of a wavefront of the laser beam incident on the phase conjugate mirror.

In further view of the above, a gas discharge laser system includes a discharge chamber filled with a gas mixture, multiple electrodes within the discharge chamber connected to a discharge circuit for energizing the gas mixture, and a resonator including the discharge chamber therein for generating a laser beam. The resonator further includes an adaptive optical element for making wavefront corrections. The adaptive optical element may include a plate with a non-planar refractive optical surface, a window on the discharge chamber with a non-planar refractive optical surface, an interferometric device with a non-planar optical surface, a non-dispersive, highly reflective mirror with a non-planar reflective optical surface, a partially reflective output coupling mirror with a non-planar reflective optical surface, or a polarizing plate with a non-planar refractive optical surface. The resonator may further include one or more line-narrowing optical elements for narrowing a bandwidth of the laser beam.

The non-planar surface of the adaptive optical element may have a contour fit to an average wavefront of the beam incident on the non-planar surface. The non-planar surface may have a contour fit to correct transient wavefront distortions. The non-planar surface of the adaptive optical element may have an adjustable contour, and the laser system may further include a detection and control system including a detector and a processor for monitoring a parameter of the laser beam indicative of a fitting of the contour of the non-planar surface of the adaptive optical element to a contour of the wavefront of the laser beam incident on the non-planar surface. The processor may be connected in a feedback loop with the adaptive optical element for controlling the contour of the non-planar surface of the adaptive optical element based upon information received from the detector. The detection and control system may further include a spectrometer.

In further view of the above, a gas discharge laser system is provided including a discharge chamber filled with a gas mixture, multiple electrodes within the discharge chamber connected to a discharge circuit for energizing the gas mixture, and a resonator including the discharge chamber therein for generating a laser beam. The resonator further includes an adaptive optical element for making wavefront corrections. The adaptive optical element may include a plate with a non-planar refractive optical surface, a window on the discharge chamber with a non-planar refractive optical surface, an interferometric device with a non-planar optical surface, a transmission grating with a non-planar optical surface, a reflection diffraction grating with a non-planar reflective optical surface, a non-dispersive, highly reflective mirror with a non-planar reflective optical surface, a partially reflective output coupling mirror with a non-planar optical surface, or a polarizing plate with a non-planar refractive optical surface. The resonator may further include one or more line-narrowing optical elements for narrowing a bandwidth of the laser beam. The non-planar surface of the adaptive optical element has an adjustable contour, and the laser system further includes a detection and control system including a detector and a processor for monitoring a parameter of the laser beam indicative of a fitting of the contour of the adaptive optical element to a contour of a wavefront of the laser beam incident on the non-planar surface. The processor may be connected in a feedback loop with the adaptive optical element for controlling the contour of the non-planar surface of the adaptive optical element based upon information received from the detector. The detection and control system may further include a spectrometer.

In further view of the above, a method for making wavefront corrections to a laser beam generated by a gas discharge laser is provided. The laser is operated for generating the laser beam. The laser beam is reflected from an intracavity retro-reflective array for making wavefront corrections. The retro-reflective array may have a non-planar contour fit approximately to an average wavefront contour of the laser beam incident upon the array. The retro-reflective array may have an adjustable contour, wherein the contour is adjusted for approximately fitting a contour of a wavefront of the laser beam incident upon the array. The adjusting may be based on detection of a parameter of the laser beam indicative of a fitting of the contour of the retro-reflective array to the contour of the wavefront of the laser beam.

In further view of the above, a method for making wavefront corrections to a laser beam generated by a gas discharge laser is provided. The laser is operated for generating the laser beam. The laser beam is reflected from an intracavity phase conjugate mirror for making wavefront corrections.

In further view of the above, a method for making wavefront corrections to a laser beam generated by a gas discharge laser is provided. The laser is operated for generating the laser beam. The laser beam is reflected from an adaptive optical element for making wavefront corrections. The adaptive optical element may include an interferometric device with a non-planar optical surface, a non-dispersive, highly reflective mirror with a non-planar reflective optical surface, or a partially reflective output coupling mirror with a non-planar optical surface. A parameter of the laser beam indicative of a fitting of the contour of the non-planar surface of the adaptive optical element to a contour of a wavefront of the laser beam may be detected, and the contour of the non-planar surface of the adaptive optical element may be adjusted based upon information obtained in the detecting step for approximately fitting the contour of the wavefront of the laser beam incident upon the array for making wavefront corrections.

In further view of the above a method for making wavefront corrections to a laser beam generated by a gas discharge laser is provided. The laser is operated for generating the laser beam. The laser beam is transmitted through an adaptive optical element for making wavefront corrections. The adaptive optical element may include a plate with a non-planar refractive optical surface, a window on a discharge chamber of the laser with a non-planar refractive optical surface, an interferometric device with a non-planar optical surface, a transmission grating with a non-planar optical surface, or a polarizing plate with a non-planar refractive optical surface. A parameter of the laser beam indicative of a fitting of the contour of the non-planar surface of the adaptive optical element to a contour of a wavefront of the laser beam may be detected, and the contour of the non-planar surface of the adaptive optical element may be adjusted based upon information obtained in the detecting step for approximately fitting the contour of the wavefront of the laser beam incident upon the array for making wavefront corrections.

INCORPORATION BY REFERENCE

Figure 1A:
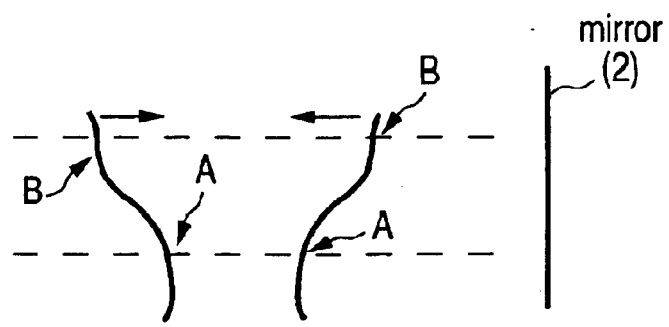
FIG. 1A schematically illustrates wavefronts incident upon and reflected from a mirror.

What follows is a cite list of references each of which is, in addition to those references cited above and below, and including that which is described in the related art description and the above invention summary, and in the claims and abstract below, are hereby incorporated by reference into the detailed description of the preferred embodiment, as disclosing alternative embodiments of elements or features of the preferred embodiments not otherwise set forth in detail below. A single one or a combination of two or more of these references may be consulted to obtain a variation of the preferred embodiments described in the detailed description below and within the scope of the present invention. Further patent, patent application and non-patent references are cited in the written description and are also incorporated by reference into the detailed description of the preferred embodiment with the same effect as just described with respect to the following references:

(1) R. K. Tyson, Principles of Adaptive Optics, Academic Press, 1991
(2) N. Tan-No et al. IEEE J.QE-16(1980)147
(3) M. D. Levenson et al. JOSA 71(1981)737
(4) H. H. Barrett and S. F. Jacobs, Opt. Lett. 4 (1979) 190
(5) R. L Sandstrom, U.S. Pat. No. 5,095,492, Mar. 10, 1992
(6) H. S. Albrecht, P. Heist, J. Kleinschrnidt, Laser for generating narrow band radiation LP Gebrauchsmusteranmeldung, 1999
(7) U.S. patent application Ser. No. 09/452,353;
(8) U.S. patent application Ser. Nos. 09/130,277, 09/244, 554, 09/718,809, 09/454,803, 09/602,184, 09/599,130, 09/598,552, 09/453,670, 09/447,882, 09/692,265, 09/532, 276, 09/416,344, 09/771,366, 09/738,849, 09/584,420, 09/574,921, 09/317,695, 60/212,257 and 09/715,803 each of which is assigned to the same assignee as the present application; and
(9) U.S. Pat. Nos. 5,946,337, 6,014,206, 6,020,723, 6,061, 382, 4,393,505, 4,977,573, 4,905,243, 6,005,880, 5,970, 082, 6,154,470, 6,212,214 and 6,094,448.

DETAILED DESCRIPTION OF THE PREFERRED EMBODIMENTS

The preferred embodiments described below generally include a laser system, such as an excimer or molecular fluorine laser system, having a resonator with an adaptable optical element, a phase conjugating mirror, or a retroreflector plate for compensating or correcting wavefront distortions. The resonator preferably has a line narrowing and/or selection module including a fixed or rotationally adjustable grating, one or more beam expanding and/or dispersive prisms, and a highly reflective mirror and/or an output coupling mirror. A preferably reflective, and alternatively transmissive, optical element of the resonator has a non-planar surface contour, which contour may be fixed and is preferably adjustable, for fitting a wavefront contour of the incident beam. Such element may be adjusted for adjusting the bandwidth. One or more optical elements of the resonator may be rotatable or may be disposed within a pressure tuned chamber, for narrowing, selecting and/or tuning the wavelength of the laser beam.

Preferably at least one of the resonator reflectors includes the adaptable optical element, phase conjugating mirror or retroreflector plate. An adaptable optical element may be a deformable mirror, such as a highly reflective mirror or output coupler, or a deformable refractive or otherwise reflective surface within the resonator, such as a grating or highly reflective mirror of a Littman configuration (see, e.g., FIG. 2b of U.S. patent application Ser. No. 09/599,130, which application is assigned to the same assignee and is hereby incorporated by reference in its entirety). If a retroreflector plate is used, then it may have steps, wherein the steps are approximately around 0.1 mm apart. The retroreflector plate may have preferably a uniform curvature, or may have an otherwise non-planar or irregular shape. In this case, a beam expander is preferably used to reduce the wavefront curvature before the retroreflector plate. The retroreflector plate may be used to correct transient wavefront distortions. A feedback loop including a processor and a detector, and also preferably a spectrometer, are preferably used for controlling the wavefront distortion correction of the adaptable optical element, phase conjugating mirror or retroreflector plate, such as by controlling the surface contour or curvature of the element.

Figure 2A:
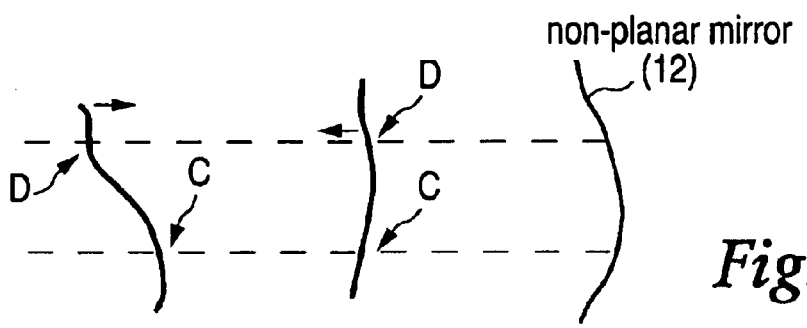
FIG. 2A schematically illustrates wavefronts incident upon and reflected from a non-planar mirror according to a preferred embodiment.

It is noted here that although these preferred embodiments are contemplated for advantageous use with excimer lasers such as ArF (193 nm) and KrF (248 nm) and molecular fluorine (157 nm) lasers operating at repetition rates of 2 kHz or more, other high power laser equipment may benefit by using any of these preferred embodiments. There are three general ways for providing wavefront corrections according to preferred embodiments herein, and these are illustrated by the three reflective components shown at FIGS. 2a–2b and 3. They are: (a) using an adaptive optical element such as a deformable mirror or refractive element, as illustrated at FIG. 2a; (b) using a phase conjugate mirror, such as that shown at FIG. 2b with a non-planar fixed or adjustable contour; and (c) using a reto-reflective array having a non-planar fixed or adjustable surface contour such as that shown at FIG. 3.

Figure 1B:
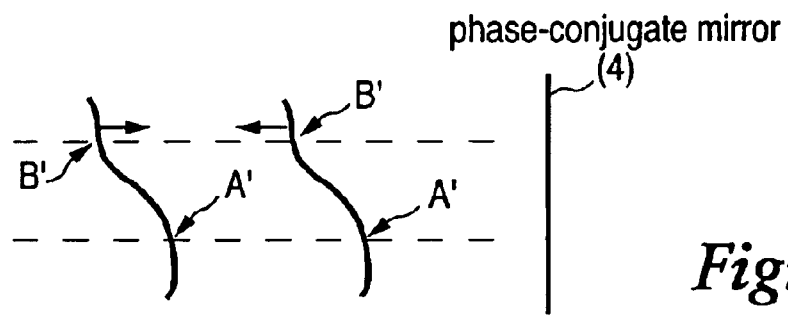
FIG. 1B schematically illustrates wavefronts incident upon and reflected from a phase conjugate mirror.
Figure 1C:
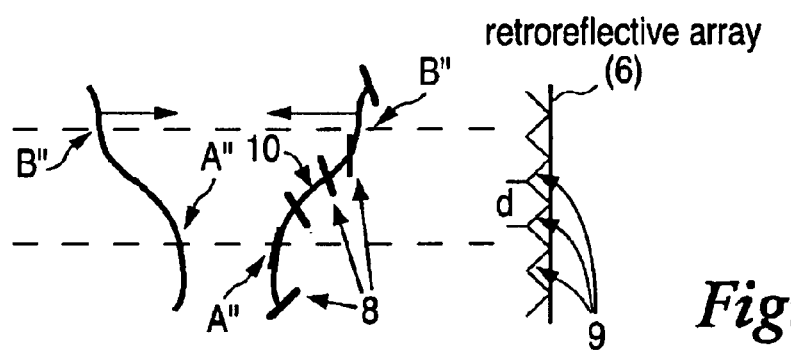
FIG. 1C schematically illustrates wavefronts incident upon and a reflected from a retro-reflective array.

FIGS. 1a–1c schematically illustrate the effect on a wavefront of reflection from a typical mirror, a phase conjugate mirror and a retro-reflective array, respectively, each having a substantially planar geometry; e.g., the adjacent corner cube segments of the retro-reflective array being arranged along a substantially planar substrate. FIG. 1a shows an incident wavefront (indicated by the arrow pointing to the right toward the mirror 2) and a reflected wavefront (indicated by the arrow pointing to the left away from the mirror 2). In FIG. 1a, the relative phases of points along the incident and reflected wavefronts are not disturbed by reflection from the mirror 2. For example, point A leads point B by a same phase difference in the incident and reflected wavefronts.

FIG. 1b shows a wavefront incident at a phase conjugate mirror 4 (indicated by arrow pointing towards the phase conjugate mirror 4) and the wavefront after reflection from the phase conjugate mirror 4 (indicated by arrow pointing away from the phase conjugate mirror 4). In FIG. 1b, the relative phases of points along the incident and reflected wavefronts are inverted. For example, point B' leads point A' in the reflected wavefront by a same phase as point A' was leading point B' in the incident wavefront, i.e., prior to reflection from the phase conjugate mirror 4.

FIG. 1c shows a wavefront incident at a retro-reflective array 6 (indicated by arrow pointing towards the retro-reflective array 6) and the wavefront after reflection from the retro-reflective array 6 (indicated by arrow point away from the retro-reflective array 6). In FIG. 1c, segments 8 of the wavefront are phase-conjugated due to double reflections from corresponding corner cubes 9 of the retro-reflective array 6, while the segments 8 of the reflected wavefront themselves generally relationally conform to the shape of the wavefront reflected from the mirror 2, as illustrated by the curve 10 shown connecting the wavefront segments 8. As such, point B" leads point A" in the reflected wavefront by an approximately same phase point B" was leading point A" in the incident wavefront, i.e., prior to reflection from the retro-reflective array 6.

Figure 2B:
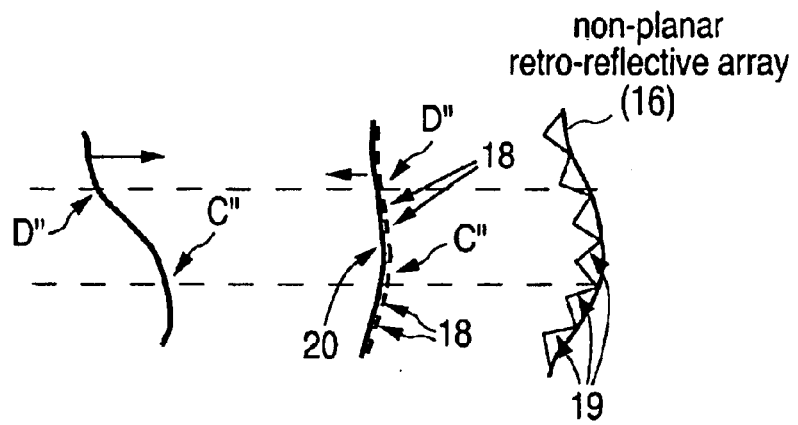
FIG. 2B schematically illustrates wavefronts incident upon and reflected from a non-planar retro-reflective array according to a preferred embodiment.

FIGS. 2a–2b schematically illustrate the effect on a wavefront of reflection from a mirror and a retro-reflective array, respectively, each having a non-planar contoured geometry according to preferred embodiments herein; e.g., the adjacent corner cube segments of the retro-reflective array being arranged along a non-planar contoured substrate. FIG. 2a shows an incident wavefront (indicated by the arrow pointing to the right toward the non-planar mirror 12) and a reflected wavefront (indicated by the arrow pointing to the left away from the non-planar mirror 12). In FIG. 2a, the relative phases of points along the incident and reflected wavefronts are adjusted along the wavefront by reflection from the non-planar mirror 12, due to variations in distances over which each point along the wavefront travels before it encounters the mirror 12. For example, point C leads point D by a far smaller phase difference in the reflected wavefront as compared with the incident wavefront.

FIG. 2a illustrates the use of a technique utilizing an adaptive optic or optics. The contour of the non-planar mirror 12 may be fixed to fit an approximate average contour of the distorted incident wavefront. Alternatively, the contour of the non-planar mirror 12 may be adjustable such as is described in the Ser. No. 09/452,353 application (incorporated by reference above), wherein the selected contour of the non-planar mirror 12 is based on optical detection and feedback control techniques such as may be described in the '353 application or in Tyson, Principles of Adaptive Optics, cited and incorporated by reference above. An intracavity telescope may be alternatively used (see reference (6) cited above in the "Incorporation by Reference section"). The spectrum of the laser radiation may be adjusted based on detection of the far field distribution in a feedback loop with a processor and contour control equipment used form adjusting the contour of the non-planar mirror 12. The spectral bandwidth of the laser, particularly for narrow band KrF-and ArF-lasers, may also be adjusted by adjusting the contour of the non-planar mirror 12 (see the '353 application).

FIG. 2b shows a wavefront incident at a non-planar retro-reflective array 16 (indicated by arrow pointing towards the non-planar retro-reflective array 16) and the wavefront after reflection from the non-planar retro-reflective array 16 (indicated by arrow point away from the non-planar retro-reflective array 16). In FIG. 2b, segments 18 of the wavefront are phase-conjugated due to double reflections from corresponding corner cubes 19 of the non-planar retro-reflective array 16, while the segments 18 of the reflected wavefront themselves generally relationally conform to the shape of the wavefront reflected from the mirror 12, as illustrated by the curve 20 shown connecting the wavefront segments 18. As such, point D" leads point C" in the reflected wavefront by a far smaller phase as compared with the phase difference between point D" and point C" in the incident wavefront, i.e., prior to reflection from the non-planar retro-reflective array 16.

Figure 3:
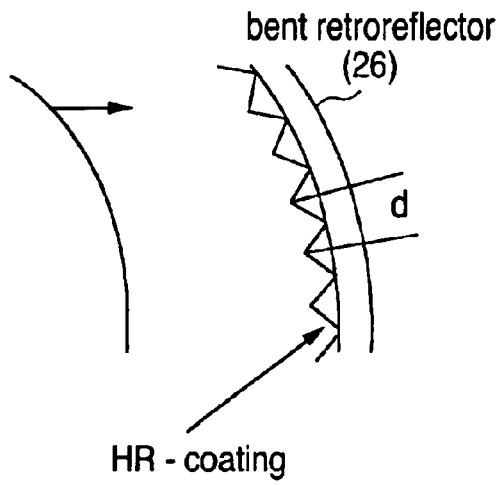
FIG. 3 schematically illustrates a bent retro-reflector fit to a contour of an incident wavefront of a laser beam according to a preferred embodiment.

FIG. 2b illustrates the use of approximate phase conjugation by a reto-reflective array. Such approximate phase conjugation may be as describe at H. H. Barrett and S. F. Jacobs, Opt. Lett. 4 (1979), 190, cited and incorporatyed by reference above. The preferred reto-reflective array includes several adjacently disposed reflective corner-cubes as illustrated in FIGS. 2b and 3. The bent retro-reflector 26 illustrated schematically at FIG. 3 is bent to have a cylindrical or spherical curvature, such as by using techniques described in the '353 application (e.g., using a piezo or a motor drive and a fine screw as illustrated at FIGS. 2 and 3 of the '353 application, or as shown and described with respect to the curved grating of any of U.S. Pat. Nos. 5,095,492, 5,970,082 or 6,094,448, cited and incorporated by reference above.

The retro-reflective array 16, 26 cuts the wavefront in many segments 18, wherein each segment fits the original wavefront in a good approximation (parallel to the original phasefront piecewise. According to Barrett et al., cited above, a wavefront retroreflected from a corner-cube array and a wavefront reflected from a "true"phase-conjugated mirror will be equal if the incident wavefront can be approximated by a plane wave over the dimension d of that corner-cube. The technique using the retro-reflective array as illustrated at FIGS. 2b and 3 is preferred herein as having some advantages over the non-planar mirror 12 and non-planar phase conjugate mirror 14 of FIGS. 2b and 2c, respectively. The retroreflector 16, 26 may be effectively used as a passive optical element, and can be used to correct wavefront distortion without any time delay, such as would occur when detection and control system is used for adjusting the contour of any of the reflectors 12, 14, 16 or 26.

As mentioned, for a plane incident wave, the retro-reflected wavefront from a corner cube array is exactly phase-conjugated. This means that the wavefront curvature of the incident wave determines the quality of the "approximate" phase conjugation. It is desired to minimize the phase deviation $\Delta\phi$ of the retroreflected wavefront relative to an exact phase conjugated phasefront. The main contribution to this deviation is given by the second order term in the Taylor expansion (see Barrett et al., above, which neglects this term). For a spherical incident wavefront with a radius of curvature R this phase deviation can be estimated to:

$$\Delta\phi \approx (\tfrac{1}{2})(2\pi/\lambda)(d^2/R) \tag{1}$$

where d is the "diameter" of one corner-cube of the array 16, 26 (as shown at FIG. 3). The phase deviation is zero for a plane wave ($R \to \infty$), in agreement with the above. If we set $\Delta\phi \ll 2\pi$, then $$(\tfrac{1}{2})(d^2/R\lambda) \ll 1; \; (\tfrac{1}{2})(d^2/R\lambda) = 0.01 \; (1\% \text{ deviation}) \tag{2}$$

As an example, if $\lambda=193$ nm (ArF laser) and d=1.0 mm, the radius of curvature should then be R>259 m. The radius of curvature $R_0$ inside the discharge tube of an ArF laser is nearly given by Ro≈discharge width/ divergence≈2 m. In order to increase the radius of curvature to achieve the desired value, the beam may be advantageously expanded according to a preferred embodiment herein using, e.g., one or more beam expanding prisms or a lens system disposed before the retro-reflective array 16, 26, to expand the beam by a factor of around M=12 or more.

To obtain a good approximation of the retroreflected wavefront to the phase-conjugated wavefront over a dimension D (n illuminated individual retro-elements of the array 16, 26), equation (2) may be modified as follows:

$$(\tfrac{1}{2})(D^2/R\lambda) \ll 1 \text{ with } D=nd \tag{3}$$

To achieve a system in conformance with equation (3), a laser system according to a preferred embodiment may be modified according to one or more of the following:

1. reduction of d, wherein for high quality corner-cube plates, d should be generally $\geq 0.1$ mm;
2. increase the magnification M, wherein an upper limit would be determined by the overall dimension of the corner-cube plate; and
3. approximately fitting the surface of the corner-cube plate to the incident wavefront by bending the plate, as illustrated at FIGS. 2b and 3.

In accordance with a preferred embodiment, then, the following procedure for providing wavefront correction by using a retroreflector plate may be advantageously followed: First, the incident beam is expanded by a factor M to increase the radius of curvature by including a beam expander before the retro-reflective array with the laser resonator. Next, the plate including the retro-reflective array 16, 26 is bent so that the surface fits an averaged wavefront (e.g., averaged over a typical burst pattern of a lithography laser) of the incident expanded beam. Third, additional time dependent wavefront distortions (deviations from the averaged wavefront) may be corrected by approximate phase conjugation.

Figure 4:
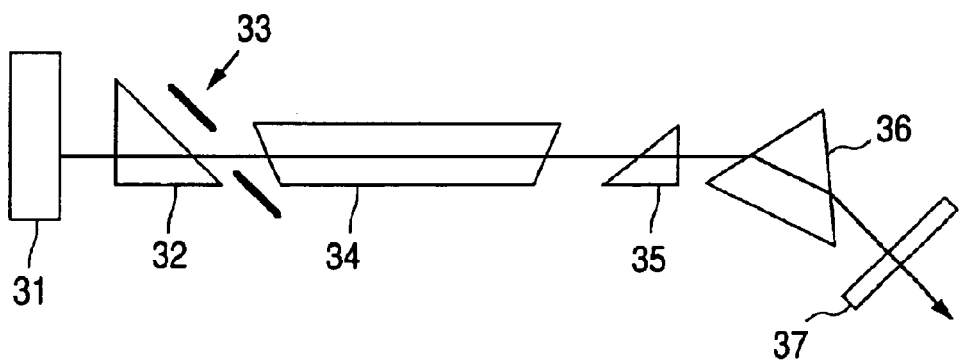
FIG. 4 schematically illustrates a laser resonator having an adaptive optical element and line narrowing optics according to a preferred embodiment.

An example of a laser resonator containing an adaptive optical reflector, a phase conjugate mirror or a retro-reflective array for making wavefront corrections according to a preferred embodiment is schematically illustrated at FIG. 4. The laser resonator shown schematically at FIG. 4 includes a wavefront correcting optic 31 such as a retro-reflector array 16, 26, non-planar fixed or deformable mirror 14 or phase conjugated mirror 12 as shown and described above with respect to FIGS. 2c and 3, FIG. 2a and FIG. 2b, respectively. The resonator includes first beam expander 32 for expanding the beam before the wavefront correcting optic 31, particularly when the retro-reflector array 16, 26 is used. A slit or aperture 33 is shown before the beam expander 32. A laser discharge tube 34 is shown, wherein details of the preferred discharge tube are describe below with respect to FIG. 5, such that its description below is incorporated here and not repeated.

On the other side of the discharge tube 34 is a second beam expander 35 for reducing beam divergence and expanding the beam before the beam is incident at narrow band optics 36 which may include one or more dispersive prisms (see the 420 application, cited above), a grism (see the '184 and '849 applications, cited above), a transmission grating (see the '849 application), an interferometric device (see the '803 application, cited above) and/or other line-narrowing and/or line-selection optics known to those skilled in the art, such as the birefringent plate described at the '257 or '695 applications, cited above, or as described at the '809 application, also cited above. An outcoupling mirror 37 is also shown for outcoupling a laser beam. The laser beam may be outcoupled by other means such as are described below in the description of the laser system of FIG. 5.

Figure 5:
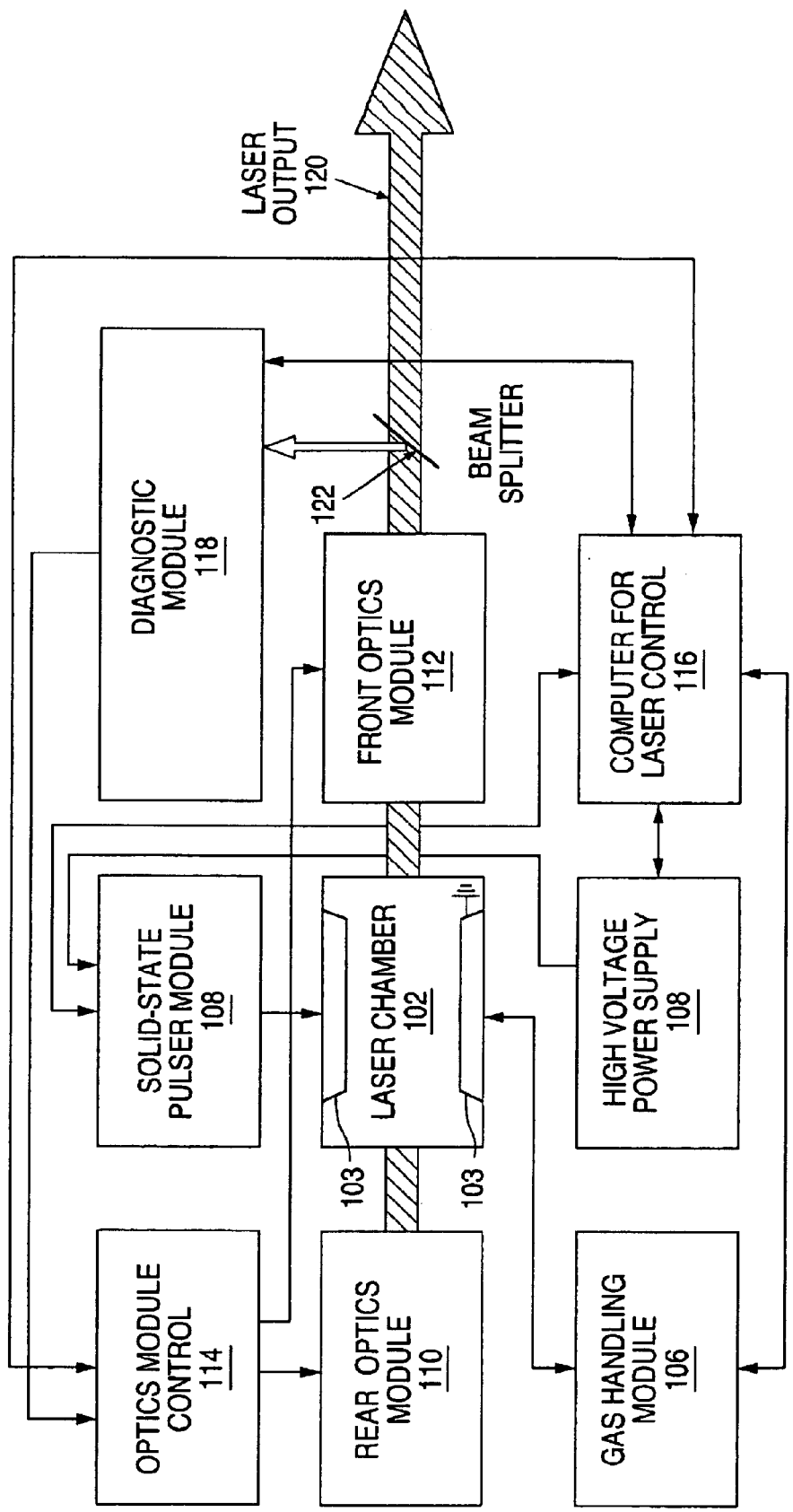
FIG. 5 schematically illustrates a laser resonator having an adaptive optical element and line-narrowing optics, together with a detection and control system according to a preferred embodiment.

FIG. 5 schematically illustrates a laser resonator having an adaptive optical element and line-narrowing optics, together with a detection and control system according to a preferred embodiment. It is noted that preferred or alternative elements referred to in the description of the system of FIG. 5 may be used with a laser resonator having a wavefront correcting optic with a fixed or adjustable non-planar contour, and may be combined with other embodiments set forth herein.

FIG. 5 schematically shows a laser system such as a KrF, ArF or $F_2$ laser system such as may be used for photolithography, in accord with a preferred embodiment. In general, the system includes a laser discharge tube or discharge chamber 102 filled with a gas mixture and having a pair of main electrodes 103 and one or more preionization electrodes (not shown). The electrodes 103 are connected to a solid-state pulser module 104. A gas handling module 106 is connected to the laser chamber 102. A high voltage power supply 108 is connected to the pulser module 104. A laser resonator is shown including the discharge chamber 102, a rear optics module 110 and a front optics module 112. An optics control module 114 communicates with the rear and front optics modules 110, 112. A computer or processor 116 controls various aspects of the laser system. A diagnostic module 118 receives a portion of the output beam 120 from a beam splitter 122.

The gas mixture in the laser chamber 102 typically includes about 0.1%F2, 1.0%Kr and 98.9% buffer gas for a KrF laser, 0.1%$F_2$, 1.0%Ar and 98.9% buffer gas for an ArF laser, and 0.1% $F_2$ and 99.9% buffer gas for the $F_2$ laser. The buffer gas preferably comprises neon for the KrF laser, neon and/or helium for the ArF laser, and helium and/or neon for the $F_2$ laser (see U.S. Pat. No. 6,157,662, which is hereby incorporated by reference). A trace amount of a gas additive such as xenon, argon or krypton may be included (see U.S. patent application Ser. No. 09/513,025, which is assigned to the same assignee as the present application and is hereby incorporated by reference).

The gas mixture is preferably monitored and controlled using an expert system (see U.S. Pat. No. 6,212,214, which is hereby incorporated by reference). One or more beam parameters indicative of the fluorine concentration in the gas mixture, which is subject to depletion, may be monitored, and the gas supply replenished accordingly (see U.S. patent applications Ser. Nos. 09/418,052 and 09/484,818, which are assigned to the same assignee and are hereby incorporated by reference). The diagnostic module 118 may include the appropriate monitoring equipment or a detector may be positioned to receive a beam portion split off from within the laser resonator (see U.S. patent application Ser. No. 09/718,809, which is assigned to the same assignee as the present application and is hereby incorporated by reference). The processor 116 preferably receives information from the diagnostic module 118 concerning the halogen concentration and initiates gas replenishment action such as micro-halogen injections, mini and partial gas replacements, and pressure adjustments by communicating with the gas handling module 106 (see U.S. patent applications Ser. Nos. 09/780,120, 09/734,459 and 09/447,882, which are assigned to the same assignee as the present application and are hereby incorporated by reference).

The diagnostic module also preferably includes a detector for measuring a parameter indicative of the wavefront correction of the wavefront correction optic 31 preferably contained in the rear optics module 110. Such parameter may be a far field intensity distribution or may otherwise be a spectral distribution or a parameter indicative thereof. The diagnostic module may include a spectrometer for this purpose. The information obtained that is indicative of the wavefront correction is sent to the processor 116 which then controls the contour of the wavefront correction optic 31 of FIG. 4 to approximately fit the wavefront of the laser beam.

Although not shown, the gas handling module 106 has a series of valves connected to gas containers external to the laser system. The gas handling module 106 may also include an internal gas supply such as a halogen and/or xenon supply or generator (see the '025 application). A gas compartment or (not shown) may be included in the gas handling module 106 for precise control of the micro halogen injections (see the '882 application and U.S. Pat. No. 5,396,514, which is hereby incorporated by reference).

The wavelength and bandwidth of the output beam 120 are also preferably monitored and controlled. Preferred and alternative wavelength calibration systems and procedures are described at U.S. Pat. Nos. 6,160,832, 4,905,243 and U.S. patent application Ser. No. 60/202,564, which are assigned to the same assignee and are hereby incorporated by reference. The monitoring equipment may be included in the diagnostic module 118 or the system may be configured to outcouple a beam portion elsewhere such as from the rear optics module, since only a small intensity beam portion is typically used for wavelength calibration. The diagnostic module 118 may be integrated with the front optics module 112, and the line-narrowing components of the resonator may be integrated in the front optics module 112, as well, such that only a HR mirror and an optional aperture are included in the rear optics module 110.

Preferred main electrodes 103 are described at U.S. patent application Ser. No. 09/453,670, which is each assigned to the same assignee as the present application and is hereby incorporated by reference. Other electrode configurations are set forth at U.S. Pat. Nos. 5,729,565 and 4,860,300, which are hereby incorporated by reference. Preferred preionization units are set forth at U.S. patent applications Ser. Nos. 09/247,887 and 09/692,265, each of which is assigned to the same assignee as the present application and is hereby incorporated by reference. The preferred solid state pulser module 104 and the high voltage power supply 108 are set forth at U.S. Pat. Nos. 6,020,723 and 6,005,880 and U.S. patent applications Ser. Nos. 09/432,348 and 09/390,146, each of which is assigned to the same assignee as the present application and is hereby incorporated by reference into the present application. The resonator includes optics for line-selection and also preferably for narrowing the selected line (see U.S. patent applications Ser. Nos. 09/317,695, 09/317,527, 09/657,396, 60/212,183, 09/599,130, 60/170,342, 60/166,967, 60/170,919, 09/584,420, 60/212,257, 60/212,301, 60/215,933, 09/130,277, 09/244,554, 60/124,241, 60/140,532, 60/140,531, 60/147,219, and 09/073,070, each of which is assigned to the same assignee as the present application, and U.S. Pat. Nos. 5,761,236 and 5,946,337, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, and 4,829,536, all of which are hereby incorporated by reference). Some of the line selection and/or line narrowing techniques set forth in these patents and patent applications may be used in combination with or alternative to any of the embodiments set forth herein.

Also, and particularly for the $F_2$ and ArF laser systems, an enclosure (not shown) may seal the beam path of the beam 120 such as to keep the beam path free of photoabsorbing species. Smaller enclosures may seal the beam path between the chamber 102 and the optics modules 110 and 112. Preferred enclosures are described in detail in U.S. patent applications Ser. Nos. 09/343,333, 09/598,552, 09/594,892, 09/131,580 and 09/771,013, each of which is assigned to the same assignee and is hereby incorporated by reference, and alternative configuration are set forth at U.S. Pat. Nos. 5,559,584, 5,221,823, 5,763,855, 5,811,753 and 4,616,908, all of which are hereby incorporated by reference.

Summarizing the above, some elements that may be advantageously used particularly with an excimer or molecular fluorine laser such as has been described with respect to FIG. 5 include the following:

1. an adaptive optical element for wavefront correction included within either of the rear or front optics modules 110, 112, or as a window on the laser tube 102;
2. the use of a non-planar mirror wither having either a fixed contour or an adjustable contour, wherein the contour may be adjusted in a feedback loop including a detector and a processor of an appropriate detection and control system;
3. the use of a ("true") phase conjugate mirror, which may also have a fixed or adjustable contour;
4. the use of a retro-reflector plate such as a corner cube array, wherein an appropriate beam expander is used for reduction of the wavefront curvature, and the retro-reflector plate is deformed either to fit the averaged wavefront of the incident laser beam or which is adjustable to fit the contour of the laser beam in a feedback loop with a detector and a processor, and possibly a spectrometer, as well, and wherein the retro-reflector array may be used to correct transient wavefront distortions, such as are produced by a laser operating in burst mode and having long and short burst pauses occurring between bursts; and
5. the use of a narrowband resonator as described with respect to the illustrative embodiments of FIGS. 4 and 5.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof.

In addition, in the method claims that follow, the operations have been ordered in selected typographical sequences. However, the sequences have been selected and so ordered for typographical convenience and are not intended to imply any particular order for performing the operations, except for those claims wherein a particular ordering of steps is expressly set forth or understood by one of ordinary skill in the art as being necessary.

What is claimed is:

1. An excimer or molecular fluorine laser system, comprising:
  a discharge chamber filled with a gas mixture at least including a halogen-containing species and a buffer gas;
  a plurality of electrodes within the discharge chamber connected to a discharge circuit for energizing the gas mixture; and
  a resonator including the discharge chamber therein for generating a laser beam, wherein the resonator further includes:
    a retro-reflective array for making wavefront corrections to the laser beam;
    a beam expander before the retro-reflective array for increasing a radius of curvature of a wavefront associated with the laser beam incident on the array; and
    one or more line-narrowing optical elements including a dispersive element other than the retro-reflective array for narrowing a bandwidth of the laser beam to 0.6 pm or less.

2. An excimer or molecular fluorine laser system, comprising:
  a discharge chamber filled with a gas mixture at least including a halogen-containing species and a buffer gas;
  a plurality of electrodes within the discharge chamber connected to a discharge circuit for energizing the gas mixture; and
  a resonator including the discharge chamber therein for generating a laser beam, wherein the resonator further includes:
    a retro-reflective array having a non-planar contour fit approximately to an average wavefront contour of the laser beam incident upon the array for making wavefront corrections;
    a beam expander before the retro-reflective array for increasing a radius of curvature of a wavefront of the laser beam incident on the array; and
    one or more line-narrowing optical elements including a dispersive element other than the retro-reflective array for narrowing a bandwidth of the laser beam to 0.6 pm or less.

3. An excimer or molecular fluorine laser system, comprising:
a discharge chamber filled with a gas mixture at least including a halogen-containing species and a buffer gas;
a plurality of electrodes within the discharge chamber connected to a discharge circuit for energizing the gas mixture; and
a resonator including the discharge chamber therein for generating a laser beam, wherein the resonator further includes:
a retro-reflective array having an adjustable contour for approximately fitting a contour of a wavefront of the laser beam incident upon the array for making wavefront corrections;
a beam expander before the retro-reflective array for increasing a radius of curvature of a wavefront of the laser beam incident on the array; and
one or more line-narrowing optical elements including a dispersive element other than the retro-reflective array for narrowing a bandwidth of the laser beam to 0.6 pm or less.

4. An excimer or molecular fluorine laser system, comprising: a discharge chamber filled with a gas mixture at least including a halogen-containing species and a buffer gas;
a plurality of electrodes within the discharge chamber connected to a discharge circuit for energizing the gas mixture; and
a resonator including the discharge chamber therein for generating a laser beam, wherein the resonator further includes:
a retro-reflective array having an adjustable contour for approximately fitting a
contour of a wavefront of the laser beam incident upon the array for making wavefront corrections;
a beam expander before the retro-reflective array for increasing a radius of curvature of the wavefront of the laser beam incident on the array; and
one or more line-narrowing optical elements including a dispersive element other than the retro-reflective array for narrowing a bandwidth of the laser beam to 0.6 pm or less,
wherein the laser system further comprises a detection and control system including a detector and a processor for monitoring a parameter of the laser beam indicative of the fitting of the contour of the retro-reflective array to the contour of the wavefront, wherein the processor is connected in a feedback loop with the array for controlling the contour of the array based upon information received from the detector.

5. The laser system of claim 4, wherein the detection and control system further comprises a spectrometer.

6. An excimer or molecular fluorine laser system, comprising:
a discharge chamber filled with a gas mixture at least including a halogen-containing species and a buffer gas;
a plurality of electrodes within the discharge chamber connected to a discharge circuit for energizing the gas mixture; and
a resonator including the discharge chamber therein for generating a laser beam, wherein the resonator further includes:

a phase conjugate mirror for making wavefront corrections;
one or more line-narrowing optical elements including a dispersive element other than the phase conjugate mirror for narrowing a bandwidth of the laser beam to 0.6 pm or less.

7. The laser system of claim 6, wherein the resonator further comprises a beam expander before the phase conjugate mirror for increasing a radius of curvature of a wavefront of the laser beam incident on the phase conjugate mirror.

8. An excimer or molecular fluorine laser system, comprising:
a discharge chamber filled with a gas mixture at least including a halogen-containing species and a buffer gas;
a plurality of electrodes within the discharge chamber connected to a discharge circuit for energizing the gas mixture; and
a resonator including the discharge chamber therein for generating a laser beam, wherein the resonator further includes:
an adaptive optical element for making wavefront corrections, said adaptive optical element being selected from the group of adaptive optical elements consisting of a plate with a non-planar refractive optical surface, a window on the discharge chamber with a non-planar refractive optical surface, an interferometric device with a non-planar optical surface, a non-dispersive, highly reflective mirror with a non-planar reflective optical surface, an partially reflective output coupling mirror with a non-planar reflective optical surface, and a polarizing plate with a non-planar refractive optical surface; and
one or more line-narrowing optical elements including a dispersive element other than the adaptive optical element for narrowing a bandwidth of the laser beam to 0.6 pm or less.

9. The laser system of claim 8, wherein the non-planar surface of the adaptive optical element has a contour fit to an average wavefront of the beam incident on the non-planar surface.

10. The laser system of claim 9, wherein the non-planar surface has a contour fit to correct transient wavefront distortions.

11. The laser system of claim 8, wherein the non-planar surface of the adaptive optical element has an adjustable contour, and wherein the laser system further comprises a detection and control system including a detector and a processor for monitoring a parameter of the laser beam indicative of a fitting of the contour of the adaptive optical element to a contour of a wavefront of the laser beam incident on the non-planar surface, wherein the processor is connected in a feedback loop with the adaptive optical element for controlling the contour of the non-planar surface of the adaptive optical element based upon information received from the detector.

12. The laser system of claim 11, wherein the detection and control system further comprises a spectrometer.

13. An excimer or molecular fluorine laser system, comprising:
a discharge chamber filled with a gas mixture at least including a halogen-containing species and a buffer gas;
a plurality of electrodes within the discharge chamber connected to a discharge circuit for energizing the gas mixture; and a resonator including the discharge chamber therein for generating a laser beam at a wavelength of substantially 248 nm or below and a bandwidth of substantially 0.6 pm or below, wherein the resonator further includes:

an adaptive optical element for making wavefront corrections, said adaptive optical element being selected from the group of adaptive optical elements consisting of a plate with a non-planar refractive optical surface, a window on the discharge chamber with a non-planar refractive optical surface, an interferometric device with a non-planar optical surface, a transmission grating with a non-planar optical surface, a non-dispersive, highly reflective mirror with a non-planar reflective optical surface, a partially reflective output coupling mirror with a non-planar optical surface, and a polarizing plate with a non-planar refractive optical surface; and one or more line-narrowing optical elements including a dispersive element other than the adaptive optical element for narrowing a bandwidth of the laser beam to 0.6 pm or less, wherein the non-planar surface of the adaptive optical element has an adjustable contour, and wherein the laser system further comprises a detection and control system including a detector and a processor for monitoring a parameter of the laser beam indicative of a fitting of the contour of the adaptive optical element to a contour of a wavefront of the laser beam incident on the non-planar surface, wherein the processor is connected in a feedback loop with the adaptive optical element for controlling the contour of the non-planar surface of the adaptive optical element based upon information received from the detector.

14. The laser system of claim 13, wherein the detection and control system further comprises a spectrometer.

15. A method for making wavefront corrections to a laser beam generated by a gas discharge laser, comprising the steps of:

operating the laser for generating the laser beam including applying electrical discharges to energize a laser gas mixture of the laser;

reflecting the laser beam from an intracavity retro-reflective array for making wavefront corrections; and passing the beam through an intracavity line-narrowing package, including a dispersive element other than said intracavity retro-reflective array, for narrowing the bandwidth of the laser beam to 0.6 pm or less.

16. A method for making wavefront corrections to a laser beam generated by a gas discharge laser, comprising the steps of:

operating the laser for generating the laser beam including applying electrical discharges to energize a laser gas mixture of the laser;

reflecting the laser beam from an intracavity retro-reflective array having a non-planar contour fit approximately to an average wavefront contour of the laser beam incident upon the array for making wavefront corrections; and passing the beam through an intracavity line-narrowing package, including a dispersive element other than said intracavity retro-reflective array, for narrowing the bandwidth of the laser beam to 0.6 pm or less.

17. A method for making wavefront corrections to a laser beam generated by a gas discharge laser, comprising the steps of:

operating the laser for generating the laser beam including applying electrical discharges to energize a laser gas mixture of the laser;

reflecting the laser beam from an intracavity retro-reflective array having an adjustable contour for making wavefront corrections;

adjusting the contour of the intracavity retro-reflective array for approximately fitting a contour of a wavefront of the laser beam incident upon the array; and passing the beam through an intracavity line-narrowing package, including a dispersive element other than said intracavity retro-reflective array, for narrowing the bandwidth of the laser beam to 0.6 pm or less.

18. A method for making wavefront corrections to a laser beam generated by a gas discharge laser, comprising the steps of:

operating the laser for generating the laser beam including applying electrical discharges to energize a laser gas mixture of the laser;

reflecting the laser beam from an intracavity retro-reflective array having an adjustable contour;

detecting a parameter of the laser beam indicative of a fitting of the contour of the retro-reflective array to a contour of a wavefront of the laser beam;

adjusting the contour of the intracavity retro-reflective array based upon information obtained in the detecting step for approximately fitting the contour of the wavefront of the laser beam incident upon the array for making wavefront corrections; and passing the beam through an intracavity line-narrowing package, including a dispersive element other than said intracavity retro-reflective array, for narrowing the bandwidth of the laser beam to 0.6 pm or less.

19. A method for making wavefront corrections to a laser beam generated by a gas discharge laser, comprising the steps of:

operating the laser for generating the laser beam including applying electrical discharges to energize a laser gas mixture of the laser;

reflecting the laser beam from an intracavity phase conjugate mirror for making wavefront corrections; and passing the beam through an intracavity line-narrowing package, including a dispersive element other than said intracavity phase conjugate mirror for narrowing the bandwidth of the laser beam to 0.6 pm or less.

20. A method for making wavefront corrections to a laser beam generated by a gas discharge laser, comprising the steps of:

operating the laser for generating the laser beam including applying electrical discharges to energize a laser gas mixture of the laser;

reflecting the laser beam from an adaptive optical element for making wavefront corrections, wherein said adaptive optical element is selected from the group of adaptive optical elements consisting of an interferometric device with a non-planar optical surface, a non-dispersive, highly reflective mirror with a non-planar reflective optical surface, and a partially reflective output coupling mirror with a non-planar optical surface; and passing the beam through an intracavity line-narrowing package, including a dispersive element other than said adaptive optical element, for narrowing the bandwidth of the laser beam to 0.6 pm or less.

21. A method for making wavefront corrections to a laser beam generated by a gas discharge laser, comprising the steps of:

operating the laser for generating the laser beam including applying electrical discharges to energize a laser gas mixture of the laser;

transmitting the laser beam through an adaptive optical element for making wavefront corrections, wherein said adaptive optical element is selected from the group of adaptive optical elements consisting of a plate with a non-planar refractive optical surface, a window on a discharge chamber of the laser with a non-planar refractive optical surface, an interferometric device with a non-planar optical surface, a transmission grating with a non-planar optical surface, and a polarizing plate with a non-planar refractive optical surface; and passing the beam through an intracavity line-narrowing package, including a dispersive element other than said adaptive optical element, for narrowing the bandwidth of the laser beam to 0.6 pm or less.

22. A method for making wavefront corrections to a laser beam generated by a gas discharge laser, comprising the steps of:

operating the laser for generating the laser beam including applying electrical discharges to energize a laser gas mixture of the laser;

reflecting the laser beam from an adaptive optical element for making wavefront corrections, wherein said adaptive optical element is selected from the group of adaptive optical elements consisting of an interferometric device with a non-planar optical surface, a non-dispersive, highly reflective mirror with a non-planar reflective optical surface, and a partially reflective output coupling mirror with a non-planar optical surface;

detecting a parameter of the laser beam indicative of a fitting of the contour of the non-planar surface of the adaptive optical element to a contour of a wavefront of the laser beam;

adjusting the contour of the non-planar surface of the adaptive optical element based upon information obtained in the detecting step for approximately fitting the contour of the wavefront of the laser beam incident upon the array for making wavefront corrections; and passing the beam through an intracavity line-narrowing package, including a dispersive element other than said adaptive optical element, for narrowing the bandwidth of the laser beam to 0.6 pm or less.

23. A method for making wavefront corrections to a laser beam generated by a gas discharge laser, comprising the steps of:

operating the laser for generating the laser beam including applying electrical discharges to energize a laser gas mixture of the laser; and transmitting the laser beam through an adaptive optical element having a non-planar surface for making wavefront corrections, wherein said adaptive optical element is selected from the group of adaptive optical elements consisting of a plate with a non-planar refractive optical surface, a window on a discharge chamber of the laser with a non-planar refractive optical surface, an interferometric device with a non-planar optical surface, a transmission grating with a non-planar optical surface, and a polarizing plate with a non-planar refractive optical surface;

detecting a parameter of the laser beam indicative of a fitting of the contour of the non-planar surface of the adaptive optical element to a contour of a wavefront of the laser beam;

adjusting the contour of the non-planar surface of the adaptive optical element based upon information obtained in the detecting step for approximately fitting the contour of the wavefront of the laser beam incident upon the array for making wavefront corrections; and passing the beam through an intracavity line-narrowing package, including a dispersive element other than said adaptive optical element, for narrowing the bandwidth of the laser beam to 0.6 pm or less.

* * * * *